United States Patent
Koshimizu

(10) Patent No.: US 8,868,942 B2
(45) Date of Patent: Oct. 21, 2014

(54) INFORMATION PROCESSING DEVICE AND METHOD FOR STARTING UP WITH STORAGE DEVICE PREHEAT AND BATTERY REHEAT

(75) Inventor: Takashi Koshimizu, Nara (JP)

(73) Assignee: Panasonic Corporation, Kadoma-shi (JP)

( * ) Notice: Subject to any disclaimer, the term of this patent is extended or adjusted under 35 U.S.C. 154(b) by 230 days.

(21) Appl. No.: 13/541,777

(22) Filed: Jul. 5, 2012

(65) Prior Publication Data

US 2013/0013937 A1 Jan. 10, 2013

(30) Foreign Application Priority Data

Jul. 8, 2011 (JP) .................................. 2011-152183
Jun. 14, 2012 (JP) .................................. 2012-134692

(51) Int. Cl.
*G06F 1/26* (2006.01)

(52) U.S. Cl.
CPC ....................................... *G06F 1/26* (2013.01)
USPC ......................................... 713/300; 219/209

(58) Field of Classification Search
CPC ..... H05B 1/0227; H05K 1/0201; G06F 1/206
USPC ......................................... 219/209; 713/300
See application file for complete search history.

(56) References Cited

U.S. PATENT DOCUMENTS 8,078,864 B2 * 12/2011 Lin et al. ............................ 713/2
8,200,993 B2 * 6/2012 Chiu ............................ 713/300

FOREIGN PATENT DOCUMENTS

JP S64-068820 A 3/1989
JP 2000-222081 A 8/2000

* cited by examiner

*Primary Examiner* — Albert Wang
(74) *Attorney, Agent, or Firm* — James W. Judge

(57) ABSTRACT

After a power switch 101 is turned on, if the temperature of the auxiliary storage device 105 detected by a first temperature detection unit 108 is lower than a determined first determination temperature T1, a power supply controller 107 turns on power supply to a heater unit 102, to start heating of the auxiliary storage device 105. After the power supply to the heater unit 102 is turned on, if the temperature of the auxiliary storage device 105 is higher than or equal to a first determination temperature T1, and if the temperature of a battery 103 detected by a second temperature detection unit 109 is higher than or equal to a determined second determination temperature T2, the power supply controller 107 starts power supply to an information-processing-device system including the CPU 104, but excluding the heater unit 102.

10 Claims, 5 Drawing Sheets

INFORMATION PROCESSING DEVICE AND METHOD FOR STARTING UP WITH STORAGE DEVICE PREHEAT AND BATTERY REHEAT

BACKGROUND OF THE INVENTION

1. Field of the Invention

The present disclosure relates to information processing devices and information-processing device startup methods.

2. Description of the Background Art

Portable notebook computers are an example of portable information processing devices provided with a battery pack housing batteries that may be used even as they are repeatedly charged, wherein in situations where there is no AC (alternating current) power supply, the system main unit of the devices is run by power being supplied from the batteries.

Here, in cases where information processing devices such as portable notebook computers as described above are used in low-temperature environments such as in colder regions of the globe, low temperature startup failures may occur due to the decrease in temperature of devices' internal components, such as an HDD (hard disk drive) or a like auxiliary storage device, a battery, and a CPU (central processing unit). For example, general HDDs are not guaranteed to operate in low-temperature environments such as below 0° C. Moreover, with respect to batteries, internal resistance increases in low-temperature environments. Therefore, the power that can be outputted from the batteries decreases, and if more power than that is needed, the voltage drops and thus startup fails. Such a phenomenon is likely to occur when there is a less remaining battery charge. Therefore, some portable notebook computers and like information processing devices designed for cold regions include heater units, and employ mechanisms where the heater units are started up concurrently when the power switch is turned on, thereby heating the HDD, being an auxiliary storage device, and the batteries, the CPU, etc.

Japanese Laid-Open Patent Publication No. S64-68820 discloses a method for starting up an information processing device at a low-temperature, in which devices whose temperature limit is lower are initially supplied with power, and after it is determined that the temperature in the information processing device has become a temperature at which the device whose temperature limit is highest can operate, the device of the highest temperature limit is supplied with power. Japanese Laid-Open Patent Publication No. 2000-222081 discloses a portable information processing device in which when the battery temperature is less than or equal to a determined value, a power supply control section supplies power to device units excepting its auxiliary storage device and its backlight, then supplies power to the auxiliary storage device, and supplies power to the backlight after hard disk spin-up. Thus, in a low-temperature environment, the information processing device can be started up by limiting the power supplied to some of the components of the information processing device.

SUMMARY OF THE INVENTION

The present disclosure provides an information processing device that can be started up by a battery operation in a low-temperature environment, and an information-processing device startup method that can start up an information processing device by a battery operation in a low-temperature environment.

An information processing device of the present disclosure is directed to an information processing device provided with a power switch, a heater unit, a battery, a CPU, an auxiliary storage device, and a power supply controller, the information processing device including: a first temperature detection unit configured to detect temperature of the auxiliary storage device; and a second temperature detection unit configured to detect temperature of the battery, wherein after supply of power to the information processing device is turned on by the power switch, if the temperature of the auxiliary storage device detected by the first temperature detection unit is lower than a determined first determination temperature T1, the power supply controller turns on supply of power to the heater unit to start heating the auxiliary storage device, and after the supply of power to the heater unit is turned on, if the temperature of the auxiliary storage device detected by the first temperature detection unit is higher than or equal to the first determination temperature T1 and the temperature of the battery detected by the second temperature detection unit is higher than or equal to a determined second determination temperature T2, the power supply controller starts supplying power to an information-processing-device system including the CPU, but excluding the heater unit.

According to the present disclosure, it is possible to provide an information processing device that can be started up by a battery operation in a low-temperature environment, and to provide an information-processing device startup method that can start up an information processing device by a battery operation in a low-temperature environment.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, embodiments will be described with reference to the drawings as appropriate. However, descriptions more detailed than necessary may be omitted. For example, detailed description of already well known matters or description of substantially identical configurations may be omitted. This is intended to avoid redundancy in the description below, and to facilitate understanding of those skilled in the art.

It should be noted that the applicant provides the attached drawings and the following description so that those skilled in the art can fully understand this disclosure. Therefore, the drawings and description are not intended to limit the subject defined by the claims.

First Embodiment

Figure 1:
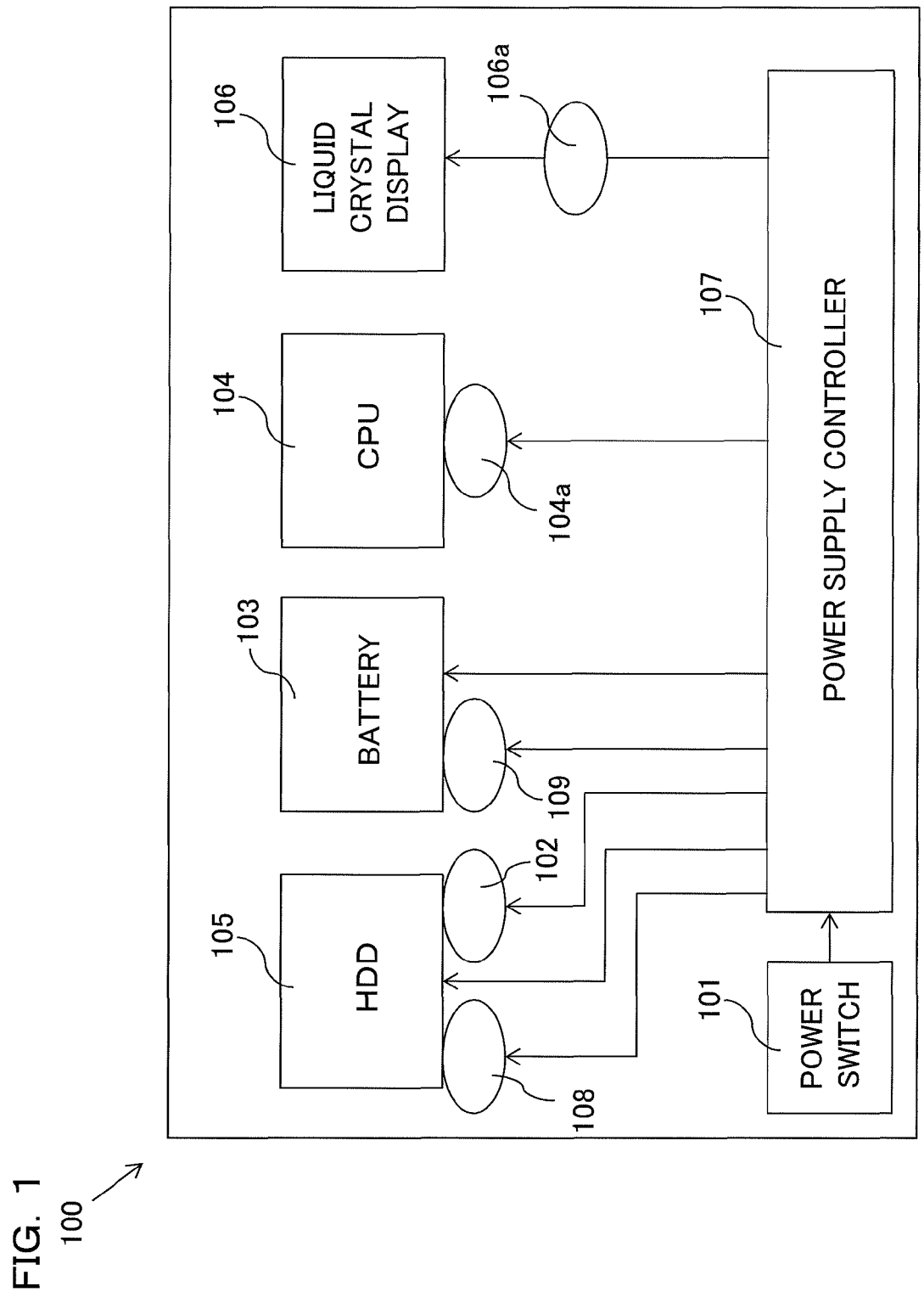
FIG. 1 is a schematic diagram showing a configuration of an information processing device according to an embodiment (first embodiment), as one mode of the present disclosure.
Figure 2:
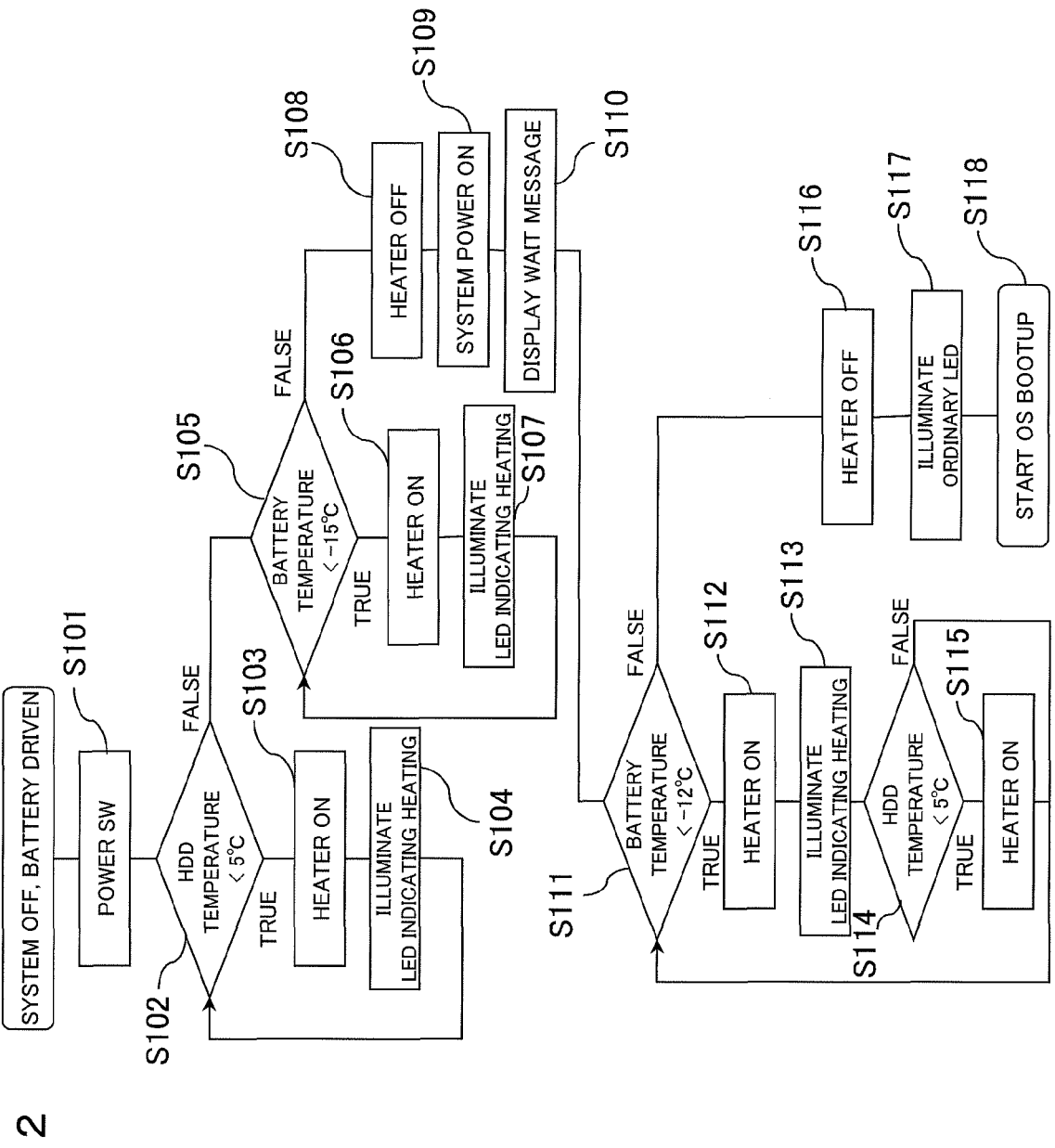
FIG. 2 is a flow chart showing a method for starting up an information processing device according to an embodiment (first embodiment), as one mode of the present disclosure.

Hereinafter, an information processing device 100 according to the present embodiment will be described with reference to the drawings. FIG. 1 is a schematic diagram showing a configuration of the information processing device 100 according to the present embodiment. FIG. 2 is a flow chart showing a method for starting up the information processing device 100 according to the present embodiment.

As shown in FIG. 1, the information processing device 100 according to the present embodiment includes a power switch 101, a heater unit 102, a battery 103, a CPU 104, an HDD 105 which is an auxiliary storage device heated by the heater unit 102, a liquid crystal display 106, a power supply controller 107, a first temperature detection unit 108, and a second temperature detection unit 109. Although not shown in FIG. 1, the information processing device 100 includes a main storage device (for example, a volatile memory). The auxiliary storage device is, for example, a non-volatile memory, and its speed of reading and writing data is slower than that of the main storage device. The auxiliary storage device is supplementarily used for backup and the like. As shown in FIG. 1, the power supply controller 107 is connected to the heater unit 102, the HDD 105, the battery 103, the CPU 104, the liquid crystal display 106, the first temperature detection unit 108, and the second temperature detection unit 109. Hereinafter, each component will be described.

<The Power Switch 101>

The power switch 101 will be described. The power switch 101 is a switch for starting up the information processing device 100 according to the present embodiment. When the power switch 101 is turned on, the information processing device 100 is started up, and when the power switch 101 is turned off, the information processing device 100 stops. A conventional known switch mechanism can be employed for the power switch 101.

<The Battery 103>

The battery 103 will be described. The battery 103 functions as a drive power supply for driving the information processing device 100. As the battery 103, an aqueous battery such as a nickel-cadmium battery or a nickel-hydrogen battery, or alternatively, a non-aqueous electrolyte battery such as a lithium secondary battery that can be quickly charged and that has a high volume energy density and a high weight energy density can be employed. The number of the batteries 103 is not particularly limited. The information processing device 100 may include a plurality of batteries 103. In the case where the information processing device 100 includes a plurality of batteries 103, the plurality of batteries 103 may be simultaneously used; or alternatively, one of the plurality of batteries 103 may be used as a main battery and the other batteries 103 may be used as preparatory batteries. The battery 103 is provided near the HDD 105. Accordingly, by using heat dissipated from the heater unit 102 for heating the HDD 105, the temperature of the battery 103 can also be increased. Since the battery 103 needs to be appropriately monitored and controlled during charge and discharge, the battery 103 is connected to a battery control board not shown.

<The CPU 104>

The CPU 104 will be described. The CPU 104 is provided so as to sequentially load, interpret, and execute programs including an operating system stored in the HDD 105 of the information processing device 100. By the CPU 104 being started up based on control by the power supply controller 107, startup of a system such as BIOS, bootup of the operating system, and the like are controlled.

Since the voltage to be consumed greatly differs depending on an operating frequency, the CPU 104 is controlled such that its operating frequency is increased or decreased as necessary by the power supply controller 107 described below. Accordingly, the proportion of voltage that can be used for heat dissipation from the battery 103 can be increased or the like, in a state where the operating frequency is limited.

<The Heater Unit 102>

The heater unit 102 will be described. As shown in FIG. 1, the heater unit 102 is provided near the HDD 105. The heater unit 102 heats the internal space of the casing which accommodates the battery 103, the CPU 104, the HDD 105, and the power supply controller 107. The heater unit 102 can be implemented by one or a plurality of heaters. In the present embodiment, an exemplary case will be explained where the heater unit 102 is implemented by one heater. As the heater, for example, a ceramic PTC heater in which, for example, an additive is added to barium titanate, or a polymer PTC heater in which conductive particles such as carbon black or nickel are dispersed in a low melting point polymer can be employed. Startup of the heater unit 102 is controlled by the power supply controller 107 described below, and when the HDD 105 and the battery 103 need to be heated, the heater unit 102 is controlled so as to heat them.

<The First Temperature Detection Unit 108>

The first temperature detection unit 108 will be described. The first temperature detection unit 108 is provided in order to detect the temperature of the HDD 105. As the first temperature detection unit 108, an NTC (negative temperature coefficient) thermistor can be used, for example. It should be noted that, the first temperature detection unit 108 is not limited to a temperature sensor using a thermistor, and may be another type of temperature sensor using a thermocouple or the like. The first temperature detection unit 108 detects the temperature of the HDD 105 as appropriate, and feeds back the detected temperature information to the power supply controller 107 described below. The power supply controller 107 refers to the fed-back temperature information, and performs controls such as turning on supply of power to the heater unit 102, increasing or decreasing the voltage to be applied to the heater unit 102.

<The Second Temperature Detection Unit 109>

The second temperature detection unit 109 will be described. The second temperature detection unit 109 is provided in order to detect the temperature of the battery 103. As the second temperature detection unit 109, as in the case of the first temperature detection unit 108, an NTC thermistor can be used, for example. It should be noted that the second temperature detection unit 109 is not limited to a temperature sensor using a thermistor, and may be another type of temperature sensor using a thermocouple or the like. The second temperature detection unit 109 detects the temperature of the battery 103 as appropriate, and feeds back the detected temperature information to the power supply controller 107 described below. The power supply controller 107 refers to the fed-back temperature information, and performs controls such as switching on and off supply of power to the heater unit 102.

<The Liquid Crystal Display 106>

The liquid crystal display 106 will be described. The liquid crystal display 106 is provided in order to display a startup state of the system, and the like. As the liquid crystal display 106, a conventional known display may be employed, and a transmissive liquid crystal display 106 or the like can be used, for example. The transmissive liquid crystal display 106 includes a planar lighting device called backlight (planar light source), and forms an image by subjecting illumination light from the backlight to spatial modulation using a liquid crystal panel.

<The Power Supply Controller 107>

The power supply controller 107 will be described. The power supply controller 107 is provided in order to control startup of internal components included in the information processing device 100 after the power switch 101 is turned on, in accordance with, for example, the flow chart shown in FIG. 2 described below. The power supply controller 107 has an integrated program that causes the power supply controller 107 to execute the steps of the flow chart shown in FIG. 2. The power supply controller 107 is realized by an integrated circuit such as an LSI, or dedicated signal processing circuits made into one chip. The LSI in the present embodiment may be referred to as an IC, a system LSI, a super LSI, or an ultra LSI, depending on the difference in the degree of integration. Furthermore, the method for circuit integration is not limited to LSI, and may be realized by a dedicated circuit or a general-purpose processor. A field programmable gate array (FPGA) that can be programmable after manufacture of the LSI, or a reconfigurable processor that allows connection and settings of the circuit cells in the LSI to be reconfigured may be used. Further, if a new circuit integration technology that replaces the LSI technology is developed as a result of an advance in the semiconductor technology, or is developed based on a technology derived from the semiconductor technology, the functional blocks may, of course, be integrated using such a technology.

<Other Internal Components>

The information processing device 100 according to the present embodiment may include, in addition to the above-described internal components, an information storage medium reader such as a DVD (digital versatile disc) drive, a graphic board, a cooling fan, and the like, as other internal components.

Hereinafter, the method for starting up the information processing device 100 of the present embodiment will be described. In the information processing device 100 according to the present embodiment, as shown in FIG. 2, when the power switch 101 is turned on (step S101), it is determined whether the temperature of the HDD 105 is lower than a determined first determination temperature T1 in step S102. In step S102, the power supply controller 107 controls the first temperature detection unit 108. The first temperature detection unit 108 detects the temperature of the HDD 105. Then, when the temperature (first detected temperature) detected by the first temperature detection unit 108 is lower than the first determination temperature T1, the power supply controller 107 turns on supply of power to the heater unit 102 (step S103). The first determination temperature T1 is, for example, a lower limit value (for example, 5° C.) of a guaranteed operating temperature range for the HDD 105. During a first heating period during which the supply of power to the heater unit 102 is set to on as a result of the first detected temperature having been determined as being lower than the first determination temperature T1, an LED is illuminated (step S104) in a notification section (display section) (not shown) provided on a face of the housing of the information processing device 100 so as to be viewable by a user, such that the user can know that the HDD 105 is being heated by the heater unit 102. The notification section is not limited to an LED. Various types of lighting device can be used as the notification section. In the notification section, in order to differentiate the first heating period from a second heating period (described below) for heating the battery 103 by the heater unit 102, a blinking cycle may be varied or the color of light to be illuminated may be changed. That is, between the first heating period and the second heating period, the blinking cycles of the notification section may be different or the colors of light emitted by the notification section may be different.

The first temperature detection unit 108 detects the temperature of the HDD 105 over time, and feeds back temperature information (first detected temperature) to the power supply controller 107. When the first detected temperature as the fed-back temperature information is higher than or equal to the first determination temperature T1, the power supply controller 107 advances to step S105 and determines whether the temperature of the battery 103 is lower than a determined second determination temperature T2. In step S105, the second temperature detection unit 109 is controlled by the power supply controller 107. The second temperature detection unit 109 detects the temperature of the battery 103. When the temperature (second detected temperature) detected by the second temperature detection unit 109 is lower than the second determination temperature T2, the power supply controller 107 maintains the supply of power to the heater unit 102 at on (step S106). The second determination temperature T2 is, for example, a lower limit value (−15° C.) of a guaranteed operating temperature range for the battery 103. During the second heating period during which the supply of power to the heater unit 102 is set at on as a result of the determination in step S105, an LED is illuminated in the notification section (display section) provided on a face of the housing of the information processing device 100 so as to be viewable by a user, such that the user can know that the battery 103 is being heated by the heater unit 102 (step S107). The notification section is not limited to an LED. Various types of lighting device can be used as the notification section. In the notification section, in order to differentiate the second heating period from the first heating period during which the heater unit 102 is heating the HDD 105 described above, a blinking cycle may be varied or the color of light to be illuminated may be changed. Although the same notification section is used for the first heating period and the second heating period in the present embodiment, a second notification section to be used for the second heating period may be provided at a position different from the position of a first notification section to be used for the first heating period.

The second temperature detection unit 109 detects the temperature of the battery 103 over time, and feeds back temperature information (second detected temperature) to the power supply controller 107. When the second detected temperature as the fed-back temperature information is higher than or equal to the second determination temperature T2, the power supply controller 107 advances to step S108, and controls a heater power supply control section (not shown) of the heater unit 102 so as to turn off the supply of power to the heater unit 102. That is, when the temperature of the battery 103 is heated higher than or equal to the second determination temperature T2, it is considered that the temperature atmosphere around the battery 103 is warm enough to start up the system such as BIOS, through heat dissipation from the battery 103 itself or through heat dissipation from the HDD 105 that has already been heated. Therefore, the supply of power to the heater unit 102 is turned off. In this case, the power supply controller 107 turns on supply of power to the system including the CPU 104 (such as the system that performs information processing using the CPU 104), excluding the heater unit 102 (step S109), whereby the CPU 104 starts operation. In the present embodiment, since supply of power to the heater unit 102 is turned off in step S108, supply of power to the heater unit 102 is not on when supply of power to the system is turned on in step S109. Accordingly, there is low possibility that the consumption of power during startup of the system becomes excessive, and thus, it is possible to reduce the possibility that startup of the system is not normally performed. Further, a wait message, for example, is displayed on the liquid crystal display 106 (step S110). It should be noted that, in step S109, the system for which supply of power is turned on may or may not include the HDD 105.

With respect to the information processing device 100 in the present embodiment, especially when being started up in a low temperature environment, even after a wait message is displayed on the liquid crystal display 106 as a result of the temperature of the battery 103 having been detected to be higher than or equal to the second determination temperature T2 by the second temperature detection unit 109, there is a possibility that the temperature of the HDD 105 decreases lower than the first determination temperature T1 again or the temperature of the battery 103 decreases lower than the second determination temperature T2. Thus, the second temperature detection unit 109 detects the temperature of the battery 103 over time and feeds back the detected temperature information to the power supply controller 107. In this case, when the temperature detected by the second temperature detection unit 109 is lower than a determined third determination temperature T3 (step S111), the power supply controller 107 causes its heater restart section to turn on again supply of power to the heater unit 102 (step S112). The third determination temperature T3 is, for example, −12° C. When the supply of power to the heater unit 102 is turned on, an LED is illuminated in the notification section as described above (step S113). Then, the first temperature detection unit 108 detects the temperature of the HDD 105 over time and it is determined whether the detected temperature of the HDD 105 is lower than a determined fourth determination temperature T4. The fourth determination temperature T4 is, for example, 5° C., which is the same as the first determination temperature T1. When the temperature detected by the first temperature detection unit 108 is lower than the fourth determination temperature T4 (step S114), the supply of power to the heater unit 102 is maintained at on (step S115) and an LED is illuminated in the notification section.

On the other hand, when the temperature detected by the first temperature detection unit 108 is higher than or equal to the fourth determination temperature T4, such temperature information is fed back to the power supply controller 107 and the power supply controller 107 advances to step S111 and receives a feedback of temperature information of the battery 103 from the second temperature detection unit 109.

As a result, when the temperature of the battery 103 is heated again until it becomes higher than or equal to the third determination temperature T3, the supply of power to the heater unit 102 is turned off (step S116), and an LED is illuminated in a different manner than the lighting manner as in the preparation steps before step S116, such that the notification section notifies that the startup preparation is now completed (step S117). Then, the CPU 104 starts bootup of the operation system (OS) (step S118).

Figure 3:
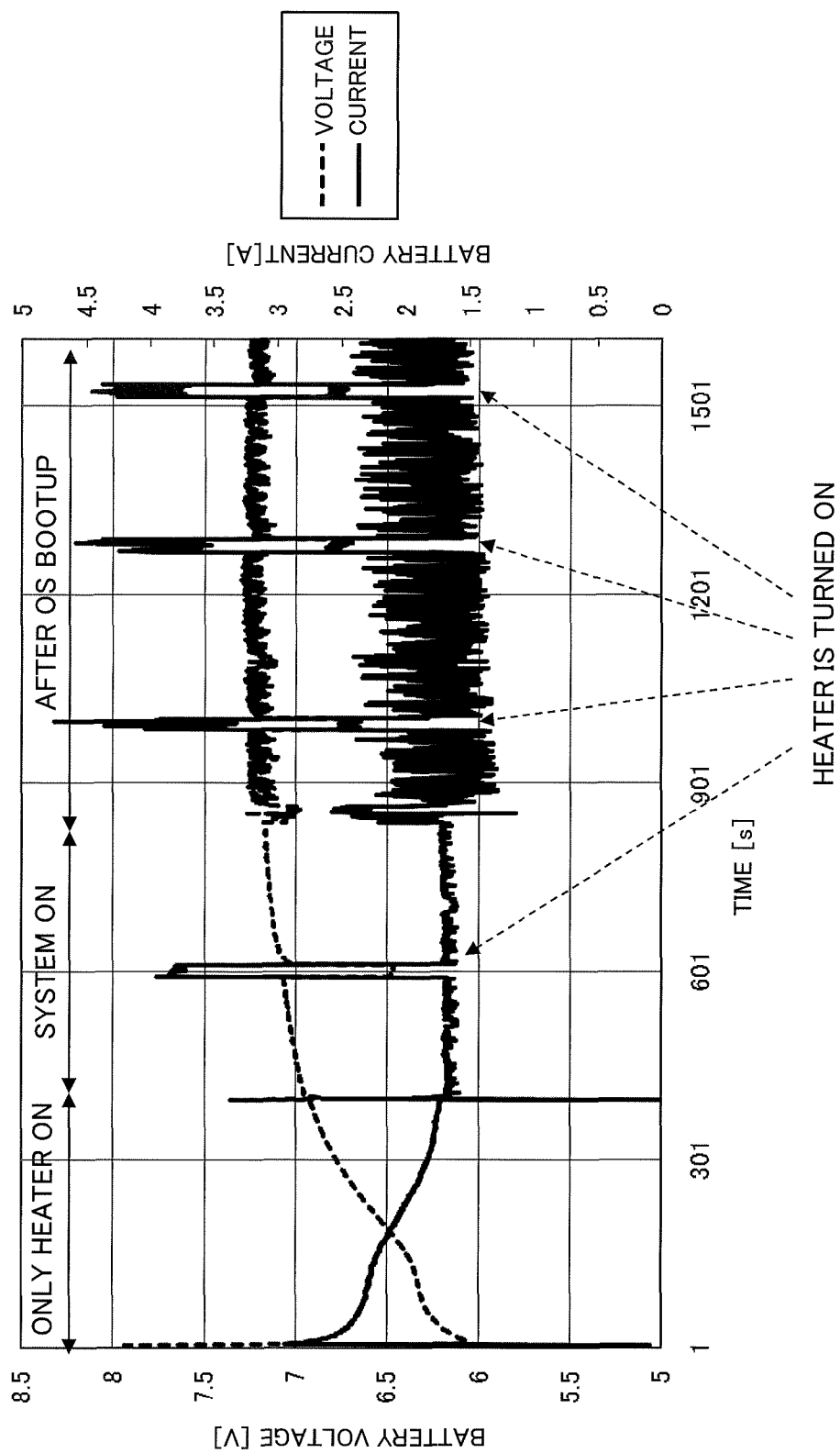
FIG. 3 is a graph illustrating temporal changes of electric current and voltage when an information processing device according to an embodiment (first embodiment), as one mode of the present disclosure, is started up in −20° C. atmosphere.

FIG. 3 is a graph illustrating temporal changes of electric current and voltage when the information processing device 100 of the present embodiment is started up in −20° C. atmosphere. As shown in FIG. 3, it is found, in the information processing device 100 according to the present embodiment, that the voltage of the battery 103 does not drop even when only the heater unit 102 is turned on and then the above-described system and the OS are started up.

In the information processing device 100 according to the present embodiment, the power supply controller 107 may limit, when allowing the CPU 104 to start operation, the operating frequency of the CPU 104 by means of a CPU control section 104a. For example, the power supply controller 107 limits the operating frequency of the CPU 104, from the time when the supply of power to the above-described system is turned on in step S109 until the OS startup is booted up in step S118. (Specifically, the operating frequency is set to an operating frequency lower than that where the heater unit 102 is not started up during startup of the information processing device 100). Further, when a wait message and the like are displayed on the display, the power supply controller 107 may limit the backlight brightness of the display by means of a liquid crystal display control section 106a. For example, the power supply controller 107 limits the backlight brightness, from the time when the display of the above-described wait message and the like is started in step S110 until an ordinary LED is illuminated in step S117. (Specifically, the backlight brightness is set to a backlight brightness lower than that where the heater unit 102 is not started up during startup of the information processing device 100.) By the control circuits controlling the internal components in this manner, it is possible to efficiently promote discharge from the battery 103, and to efficiently increase the temperature of the battery 103 through self-heating.

In the present embodiment, description has been given of an exemplary case where the heater unit 102 includes one heater, or an exemplary case where when the heater unit 102 includes a plurality of heaters, supply of power to all of the heaters are simultaneously turned on or off. However, the control of the heater unit 102 is not limited to the present embodiment. For example, in the heater unit 102 including a plurality of heaters, one of the plurality of heaters may be controlled as a heater for which supply of power is firstly turned on during startup. Accordingly, while maintaining the voltage needed during startup at a low value, it is possible to efficiently heat the HDD 105 and the like. In particular, in a case where the heater unit 102 includes a plurality of heaters having activation voltages that differ from one another, if only a heater having a low activation voltage is controlled so as to be turned on by a heater startup controlling section of the heater unit 102 controlled by the power supply controller 107, the voltage needed during startup can be made minimum, which is more efficient.

In the present embodiment, it is possible to appropriately determine whether the battery 103 can be started up, and to prevent consuming an excessive power by turning off supply of power to the heater unit 102. When the HDD 105 is sufficiently heated, the operating system can be booted up by effectively utilizing heat dissipated from the HDD 105. In this respect, in the present embodiment, after it is determined whether the temperature of the HDD 105 is lower than the first determination temperature T1, when the temperature of the HDD 105 is higher than or equal to the first determination temperature T1, the second temperature detection unit 109 detects the temperature of the battery 103. However, the present embodiment is not limited the above configuration. For example, after the power switch 101 is turned on, the second temperature detection unit 109 may firstly detect whether the temperature of the battery 103 is lower than the second determination temperature T2, and when the temperature of the battery 103 is higher than or equal to the second determination temperature T2, the temperature of the HDD 105 may be detected.

Further, description has been given of an exemplary case where, after a wait message is displayed on the liquid crystal display 106, when the temperature of the battery 103 has decreased lower than the third determination temperature T3 again, and when the temperature of the HDD 105 has decreased lower than the fourth determination temperature T4, supply of power to the heater unit 102 is turned on again. However, such a configuration is not necessarily required, and the OS bootup may be started simultaneously when the above described system is turned on.

As described above, by causing the HDD 105 to reach its operable temperature first, a failure of the HDD 105 is prevented and the OS stored in the HDD 105 can be booted up. Consequently, the startup time for the system in a low-temperature environment can be shortened.

In the above embodiment, the first determination temperature and the fourth determination temperature may be values determined based on the lower limit value of the guaranteed operating temperature range of the HDD 105, and any value in a range of, for example, ±5° C. of the lower limit value can be used. Moreover, the second determination temperature may be a value determined based on the lower limit value of the guaranteed operating temperature range of the battery 103, and any value in a range of, for example, ±5° C. of the lower limit value can be used. It should be noted that it is sufficient that the third determination temperature is a temperature higher than or equal to the second determination temperature, and it is sufficient that the fourth determination temperature is a temperature higher than or equal to the first determination temperature.

Effect and the Like

As described above, according to the information processing device 100 of the present embodiment, it is possible to provide the information processing device 100 that can be started up by the operation of the battery 103 in a low-temperature environment.

Figure 4:
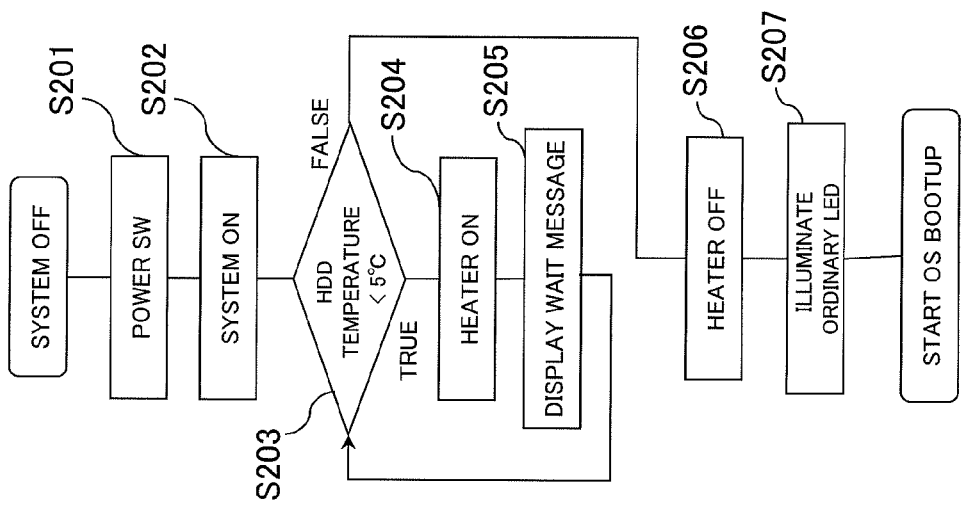
FIG. 4 is a flow chart showing a conventional method for starting up an information processing device described in the effect and the like of the below embodiment.
Figure 5:
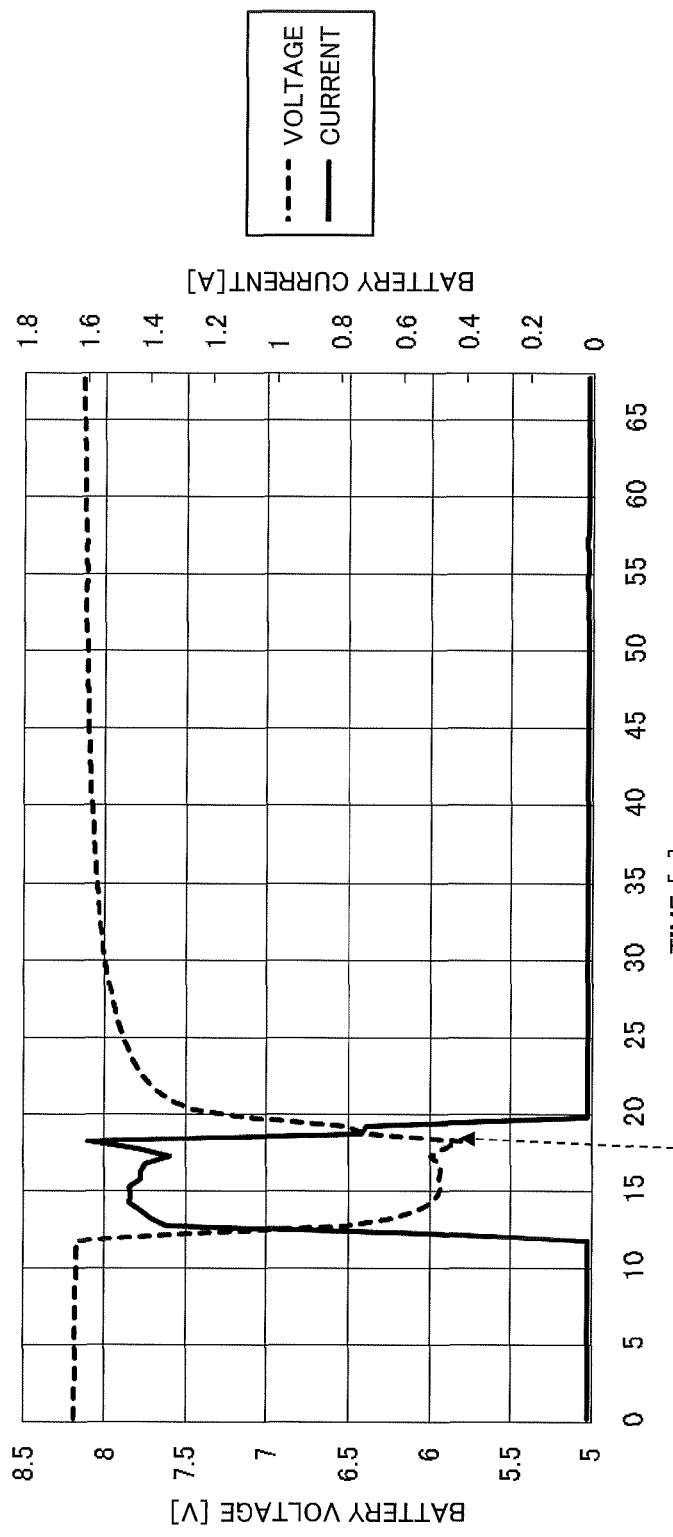
FIG. 5 is a graph illustrating temporal changes of electric current and voltage when a conventional information processing device described in the effect and the like of the below embodiment is started up in −20° C. atmosphere.

Here, FIG. 4 shows an example of an another information-processing device startup method in a low-temperature environment. As shown in FIG. 4, according to an another startup method, after a power switch is turned on (step S201), the system is started up (step S202). Then, the temperature of the HDD is detected (step S203). When the detected temperature is below a determined temperature (FIG. 4 shows an exemplary case where the determined temperature is 5° C.) (step S203), a heater unit is controlled to be turned on (step S204). This means that before the temperature of the HDD is detected, startup of systems such as the BIOS (basic input/output system), and of the CPU, liquid crystal display, and the like is simultaneously begun. This causes a large consumption of power from batteries that are not sufficiently heated yet and thus in a low-temperature condition. In this case, as shown in FIG. 5, a situation occurs where the voltage of the battery drops and the operating system (OS) stored in the HDD cannot be booted up. Traditional portable notebook computers and like information processing devices had lower performance than what is desired now, and the power, etc. they required at system launch was far less than what today's devices do. Thus, the conventional startup method in some cases did not give rise to any problems. However, associated with improved performance of portable notebook computers and like information processing devices, the power, etc. required by their internal components has increased. Thus, it is becoming more difficult for such a startup method to sufficiently boot up the operating system under low-temperature environments.

On the other hand, the startup method according to Japanese Laid-Open Patent Publication No. S64-68820 merely starts up the devices sequentially, when the temperature of each device has reached a temperature which allows startup of the device, and is not made in consideration of the state of the battery. Presumably therefore, a battery in a low-temperature condition cannot afford the power required by each device. Further, the information processing device according to Japanese Laid-Open Patent Publication No. 2000-222081 supplies power to the auxiliary storage device at the point when the battery has become operable. Therefore, if the temperature of the auxiliary storage device has not reached the operable temperature, the auxiliary storage device may fail during spin-up, and even if it does not fail, the operating system stored in the auxiliary storage device might not be bootable.

The present embodiment has been made in view of the above problems, and provides the information processing device 100 that can be started up by the operation of the battery 103 in a low-temperature environment.

In the present embodiment, if the temperature of the HDD 105 detected by the first temperature detection unit 108 is higher than or equal to the first determination temperature T1, and the temperature of the battery 103 detected by the second temperature detection unit 109 is higher than or equal to the second determination temperature T2, the power supply controller 107 turns off the supply of power to the heater unit 102 before starting supply of power to the systems.

Whereby, it is possible to appropriately determine whether the battery 103 can be started up, and to prevent an excessive consumption of power by turning off the supply of power to the heater unit 102 before starting supply of power to the system. Further, by turning on the heater unit 102 and effectively utilizing the heat dissipated during heating of the HDD 105, it is possible to boot up the operating system even in a low-temperature environment.

In the present embodiment, after the supply of power to the system is started, if the temperature of the battery 103 detected by the second temperature detection unit 109 is lower than the determined third determination temperature T3, or if the temperature of the HDD 105 detected by the first temperature detection unit 108 is lower than the determined fourth determination temperature T4, the power supply controller 107 turns on supply of power to the heater unit 102.

Whereby, it is possible to restart the heater unit 102 as necessary, and even if the temperature of the internal component such as a battery 103 becomes a low temperature again, it is possible to heat the internal component. Accordingly, voltage and the like of the battery 103 do not drop and the operating system can be booted up in a stable manner.

In the present embodiment, for example, the heater unit 102 may include a plurality of heaters having activation voltages that differ from one another, and when carrying out heating of the battery 103 or the HDD 105, the power supply controller 107 may select a heater having a lower activation voltage among the plurality of heaters, and may turn on supply of power to the selected heater.

In the case, it is possible to start up only a heater having a low activation voltage, whereby it is possible to efficiently heat the HDD 105 and the like while making the voltage needed during startup minimum.

In the present embodiment, the power supply controller 107 limits at least one of either the operating frequency of the CPU 104, or the backlight brightness of the liquid crystal display 106 for the information processing device 100.

Whereby, it is possible to efficiently promote discharge of the battery 103 and to efficiently increase the temperature of the battery 103 through self-heating.

In the present embodiment, the information processing device 100 includes the notification section for notifying a user that the supply of power to the heater unit 102 is on.

Whereby, it becomes easier for the user to determine that the internal component such as the HDD 105 is being heated.

A method for starting up the information processing device 100 according to the present embodiment, an information processing device 100 provided with the power switch 101, the CPU 104, the HDD 105, the battery 103, and the heater unit 102, comprising the steps of: turning on, if after the power switch 101 is turned on, temperature of the HDD 105 is lower than the determined first determination temperature T1, supply of power to the heater unit 102 to start heating of the HDD 105; and starting, if after the supply of power to the heater unit 102 is turned on, the temperature of the HDD 105 is higher than or equal to the first determination temperature T1 and temperature of the battery 103 is higher than or equal to the determined second determination temperature T2, supply of power to the information-processing-device system including the CPU 104, but excluding the heater unit 102.

Whereby, it is possible to start up the information processing device by a battery operation in a low-temperature environment.

As described above, embodiments have been described as examples of implementation in the present disclosure. Thus, the attached drawings and detailed description have been provided.

Therefore, in order to illustrate the implementation, not only essential elements for solving the problems but also elements that are not necessary for solving the problems may be included in elements appearing in the attached drawings or in the detailed description. Therefore, such unnecessary elements should not be immediately determined as necessary elements because of their presence in the attached drawings or in the detailed description.

Further, since the embodiments described above are merely examples of the implementation, it is understood that various modifications, replacements, additions, omissions, and the like can be performed in the scope of the claims or in an equivalent scope thereof.

What is claimed is:

1. An information processing device provided with a power switch, a heater unit, a battery, a CPU, an auxiliary storage device, and a power supply controller, the information processing device comprising:
    a first temperature detection unit configured to detect temperature of the auxiliary storage device; and
    a second temperature detection unit configured to detect temperature of the battery; wherein
    after supply of power to the information processing device is turned on by the power switch, if the temperature of the auxiliary storage device detected by the first temperature detection unit is lower than a determined first determination temperature T1, the power supply controller turns on supply of power to the heater unit to start heating the auxiliary storage device, and after the supply of power to the heater unit is turned on, if the temperature of the auxiliary storage device detected by the first temperature detection unit is higher than or equal to the first determination temperature T1 and the temperature of the battery detected by the second temperature detection unit is higher than or equal to a determined second determination temperature T2, the power supply controller starts supplying power to an information-processing-device system including the CPU, but excluding the heater unit, and after the power supply controller starts supplying power to the system, if the temperature of the battery detected by the second temperature detection unit is lower than a determined third determination temperature T3, or if the temperature of the auxiliary storage device detected by the first temperature detection unit is lower than a determined fourth determination temperature T4, the power supply controller turns on supply of power to the heater unit.

2. The information processing device according to claim 1, wherein
    if the temperature of the auxiliary storage device detected by the first temperature detection unit is higher than or equal to the first determination temperature T1, and the temperature of the battery detected by the second temperature detection unit is higher than or equal to the second determination temperature T2, the power supply controller turns off the supply of power to the heater unit before starting supply of power to the systems.

3. The information processing device according to claim 1, wherein
    the heater unit includes a plurality of heaters having activation voltages that differ from one another, and
    when carrying out heating of the battery or the auxiliary storage device, the power supply controller selects a heater having a lower activation voltage among the plurality of heaters, and turns on supply of power to the selected heater.

4. The information processing device according to claim 1, wherein
    the power supply controller limits at least one of either an operating frequency of the CPU, or a backlight brightness of a liquid crystal display for the information processing device.

5. The information processing device according to claim 1, comprising
    a notification section for notifying a user that the supply of power to the heater unit is on.

6. A method for starting up an information processing device provided with a power switch, a CPU, an auxiliary storage device, a battery, and a heater unit, comprising the steps of:
    turning on, if after the power switch is turned on, temperature of the auxiliary storage device is lower than a determined first determination temperature T1, supply of power to the heater unit to start heating of the auxiliary storage device; and
    starting, if after the supply of power to the heater unit is turned on, the temperature of the auxiliary storage device is higher than or equal to the first determination temperature T1 and temperature of the battery is higher than or equal to a determined second determination temperature T2, supply of power to an information-processing-device system including the CPU, but excluding the heater unit, wherein
    after the supply of power to the system is started, if the temperature of the battery is lower than a determined third determination temperature T3, or if the temperature of the auxiliary storage device is lower than a determined fourth determination temperature T4, a heater restart step of turning on supply of power to the heater unit is performed.

7. The information-processing-device startup method according to claim 6, wherein
    if the temperature of the auxiliary storage device is higher than or equal to the first determination temperature T1, and the temperature of the battery is higher than or equal to the second determination temperature T2, a step of turning off the supply of power to the heater unit is performed before performing the step of starting supply of power to the systems.

8. The information-processing-device startup method according to claim 6, wherein the heater unit includes a plurality of heaters having activation voltages that differ from one another, and when heating of the battery or the auxiliary storage device is carried out, a heater having a lower activation voltage among the plurality of heaters is selected, and supply of power to the selected heater is turned on.

9. The information-processing-device startup method according to claim 6, wherein a step of limiting at least one of either an operating frequency of the CPU, or a backlight brightness of a liquid crystal display for the information processing device is performed.

10. The information-processing-device startup method according to claim 6, wherein a step of notifying a user that the supply of power to the heater unit is on is performed.

\* \* \* \* \*